US012094695B2

(12) United States Patent
Ni et al.

(10) Patent No.: US 12,094,695 B2
(45) Date of Patent: Sep. 17, 2024

(54) MULTI-ZONE TEMPERATURE CONTROL PLASMA REACTOR

(71) Applicant: Advanced Micro-Fabrication Equipment Inc. China, Shanghai (CN)

(72) Inventors: Tuqiang Ni, Shanghai (CN); Steven Lee, Shanghai (CN); Sha Rin, Shanghai (CN); Zhou Xiaofeng, Shanghai (CN); Mei Rui, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 419 days.

(21) Appl. No.: 16/678,800

(22) Filed: Nov. 8, 2019

(65) Prior Publication Data

US 2020/0161104 A1    May 21, 2020

(30) Foreign Application Priority Data

Nov. 21, 2018   (CN) .......................... 201811391849.0

(51) Int. Cl.
*H01J 37/32* (2006.01)
*H01L 21/683* (2006.01)
*H05B 1/02* (2006.01)

(52) U.S. Cl.
CPC ............... *H01J 37/32724* (2013.01); *H01J 37/32174* (2013.01); *H01L 21/6833* (2013.01); *H05B 1/0233* (2013.01)

(58) Field of Classification Search
CPC .......... H01J 37/32174; H01J 37/32724; H01L 21/67103; H01L 21/67248; H01L 21/6831; H01L 21/6833; H05B 1/0233; H05B 3/265

(Continued)

(56) References Cited

U.S. PATENT DOCUMENTS 4,500,893 A * 2/1985 Sakura ........................ B41J 2/35
347/210
5,254,826 A * 10/1993 Kimura .................. B23H 7/065
219/69.19

(Continued)

FOREIGN PATENT DOCUMENTS

CN    1394459 A    1/2003
CN    103187943 A    7/2013

(Continued)

*Primary Examiner* — Sang Y Paik
(74) *Attorney, Agent, or Firm* — Womble Bond Dickinson (US) LLP; Joseph Bach, Esq.

(57) ABSTRACT

Disclosed is a plasma reactor, comprising: a reaction chamber; a base disposed at the bottom of the reaction chamber, configured for supporting a substrate; an RF power supply which outputs an RF power into the reaction chamber, wherein the base includes an electrostatic chuck, the electrostatic chunk including a set of heaters, the set of heaters including a plurality of heating modules, wherein each heating module includes one heater and one electronic switch which are connected in series, the heater in each heating module being connected to one of the heating power source and the ground, and the electronic switch being connected to the other one of the heating power source and the ground; a heating controller including a receive end configured for receiving a temperature control signal, and further a drive signal output end connected to the electronic switch, configured for outputting a drive signal of the electronic switch, wherein the heating controller further comprises at least one optoelectrical drive circuit to cause the receive end of the heating controller to be electrically isolated from the drive signal output end.

8 Claims, 3 Drawing Sheets

(58) Field of Classification Search
USPC .................................... 219/442, 507–511
See application file for complete search history.

(56) References Cited

U.S. PATENT DOCUMENTS

| | | | | |
|---|---|---|---|---|
| 5,352,864 | A * | 10/1994 | Schultheis | H05B 3/746 |
| | | | | 219/448.17 |
| 5,519,188 | A * | 5/1996 | Yuichi | A01K 41/02 |
| | | | | 236/3 |
| 6,387,208 | B2 | 5/2002 | Satoyoshi et al. | |
| 6,554,954 | B2 * | 4/2003 | Ma | H01J 37/32697 |
| | | | | 156/345.47 |
| 6,624,579 | B2 * | 9/2003 | Yasui | H05B 6/685 |
| | | | | 219/715 |
| 8,637,794 | B2 | 1/2014 | Singh et al. | |
| 9,240,330 | B2 | 1/2016 | Takeda et al. | |
| 9,324,589 | B2 | 4/2016 | Pease et al. | |
| 9,400,139 | B2 | 7/2016 | Millner et al. | |
| 9,472,435 | B2 | 10/2016 | Parkhe et al. | |
| 10,049,948 | B2 | 8/2018 | Gaff et al. | |
| 10,563,919 | B2 | 2/2020 | Won et al. | |
| 10,690,705 | B2 | 6/2020 | Breitlow et al. | |
| 11,495,443 | B2 | 11/2022 | Okunishi et al. | |
| 2009/0159566 | A1 | 6/2009 | Brillhart et al. | |
| 2010/0271744 | A1 * | 10/2010 | Ni | H01L 22/14 |
| | | | | 361/233 |
| 2013/0220989 | A1 * | 8/2013 | Pease | H01L 21/67103 |
| | | | | 219/458.1 |
| 2017/0186592 | A1 * | 6/2017 | Ni | H01J 37/32532 |
| 2018/0149679 | A1 * | 5/2018 | Hernandez | G01N 22/00 |
| 2020/0027706 | A1 * | 1/2020 | Jing | H01L 21/67248 |

FOREIGN PATENT DOCUMENTS

| | | |
|---|---|---|
| CN | 103854947 A | 6/2014 |
| CN | 104205307 A | 12/2014 |
| CN | 105474381 A | 4/2016 |
| CN | 107331595 A | 11/2017 |
| CN | 107342207 A | 11/2017 |
| CN | 108735569 A | 11/2018 |
| JP | 2002110337 A | 4/2002 |
| JP | 2002110338 A | 4/2002 |
| KR | 20020005462 A | 1/2002 |
| KR | 20120103596 A | 9/2012 |
| KR | 20140070494 A | 6/2014 |
| KR | 20170123830 A | 11/2017 |
| TW | 200937563 A | 9/2009 |
| TW | 201401474 A | 1/2014 |
| TW | 201606925 A | 2/2016 |
| TW | 201806440 A | 2/2018 |
| WO | 2012175313 A1 | 12/2012 |

* cited by examiner

MULTI-ZONE TEMPERATURE CONTROL PLASMA REACTOR

RELATED APPLICATION

The present application claims priority to and the benefit of Chinese Patent Application No. 201811391849.0, filed on Nov. 21, 2018, and the disclosure of which is hereby incorporated herein by reference in its entirety.

FIELD

The present disclosure relates to a plasma reactor, and more specifically relates to a temperature control apparatus for a multi-zone temperature control base in the plasma reactor.

BACKGROUND

A semiconductor chip manufacturing procedure includes many micro-processing steps. Typical plasma etching reactors may form, on the wafer, various kinds of vias or grooves at micron or even nanometer scale; in further combination with other processes such as CVD (Chemical Vapor Deposition), various types of semiconductor chip products are finally fabricated. As the etching process becomes increasingly demanding, the demand on control precision of wafer or substrate temperature during a plasma treatment process also becomes increasingly high. Conventional independent temperature control zones are inner and outer arranged 2 or 3 ring shaped zones, these layouts cannot satisfy the processing requirements, such as temperature differences in different parts of the same temperature control zone always excess the acceptable limit. To further enhance wafer temperature controllability, the prior art provides an array of heaters with matrixed layout and independent control, wherein the array of heaters is integrated between the electrostatic chuck and the electrically conductive base as a lower electrode.

FIG. 1 shows a typical plasma reactor, which comprises a chamber 100; and an electrically conductive base 30 disposed at the bottom inside the cavity, wherein the electrically conductive base further serves as the lower electrode to be connected to at least one high-frequency radio-frequency (RF) power supply 19. After the plasma above the wafer (or other shaped substrate) is ignited, the RF power supply 19 may adjust plasma concentration or energy. In the plasma reactor, there may be further provided other types of RF power supplies, e.g., a gas shower head which connects a RF power supply to the top inside the reaction chamber; or an inductive coil disposed above the reactor chamber to generate and feed the magnetic field into the reaction chamber and maintain plasma concentration. The electrically conductive base is fixed to the bottom of the chamber via a support device 20, wherein the chamber 100 and the support device 20 are both made of conductors and electrically grounded so as to prevent leakage of the RF electrical field to the outside.

The electrostatic chuck 40 is disposed on the electrically conductive base, wherein the electrostatic chuck 40 includes a plurality of electrical insulating materials, and an electrode 42 for implementing electrostatic adsorption is embedded inside the electrostatic chuck 40, such that when the electrode 42 connects with an external high-voltage direct-current (DC) power supply, the to-be-processed wafer 50 is electrostatically adsorbed to the electrostatic chuck 40. A set of heaters 41 for multi-zone heating is further provided below the electrode 42 in the electrical insulating material layers, wherein the set of heaters includes a large number of independently controllable heaters, wherein the number of heaters may be 10*10=100 or 15*15=225 or even more. The heaters 41 may be resistance wires or other devices that may receive current and transform to heating.

To individually control the large number of independently controlled heaters, a considerable number of current supply lines and current return lines are required, wherein the current supply lines are connected to the high-voltage heating power source, and the current return lines are connected to the ground. With the 10*10 matrix as an example, the heaters in each row and each column are all connected to one current supply line or current return line; such a layout needs current supply lines and current return lines at least 10+10=20. As shown in FIG. 1, the power of the heating power source enters the set-of-heaters controller 60 via a power bus 11: meanwhile, the set-of-heaters controller 60 is further connected to a process controller via a control signal input line 12 so as to receive heating power distribution data configured by the process controller; based on the heating power distribution data as received, the controller 60 may generate control signal to control on-time of a drive switch or control duty ratio of a drive switch. The set-of-heaters controller 60 further comprises a plurality (e.g., 20) of drive switches; and by selecting on- or off-state of a set of drive switches, one current supply line and one current return line in the set of heaters communicate with an external heating power source and the ground; the one current supply line and the one current return line, which communicate with each other, form a loop. One heater in the set of heaters is heated; after the one heater is heated for a certain period time, another heater is in turn heated; in this way, each to-be-heated heater is scanned in turns, such that the heating power of each heater can be individually adjustable. Such a passive type of heating power source and control method requires communicating the current supply line and the current return line to the set of heaters in the electrostatic chuck 40; however, the electrostatic chuck is positioned in a RF radiation environment, such that a set of filters 16 needs to be further provided, wherein each current supply line and each current return line need to be serially connected with a filter. The heating power source lines 15 (including 20 current supply lines and current return lines) connected to the set-of-heaters controller 60 first pass through the set of filters 16 and then through a second heating power source line 17 to enter the RF environment inside the reaction chamber, and afterwards penetrate through the through-holes (not shown) provided on the electrically conductive base 30 so as to be connected to the set of heaters 41 in the electrostatic chuck 40. Such arrangement of a considerable number of filters not only costs dearly, but also occupies a large space, which raises difficulty for designing, manufacturing, and maintaining the plasma processing apparatus; besides, for such a passively heating type of the set of heaters, only one heater can be heated at each time; to change temperature distribution, the set of heaters 41 must go through many scanning periods for scanning all heaters in the set of heaters 41, which cannot be adapted to rapid temperature changes. On the other hand, although long-term connection of a single filter to the RF radiation environment may block most RF leakage, but too many filters will still cause considerable leakage of RF energy towards the set-of-heaters controller 60 below, which not only causes power loss, but also damages the controller 60 in extreme case.

Therefore, it is desired to provide a novel multi-zone temperature control plasma reactor, which may not only have a simplified structure, a lower cost, and a higher system reliability, but also may rapidly change temperature distribution.

SUMMARY

The present disclosure provides a plasma reactor to implement stable and reliable matrix-type multi-zone temperature control of a substrate, wherein the plasma reactor comprises: a reaction chamber enclosing a reaction space; a base disposed at the bottom of the reaction chamber, configured for supporting the substrate; a radio frequency RF power supply which outputs RF power into the reaction chamber to generate and maintain plasma, wherein the base includes an electrode and an electrostatic chuck disposed above the base, the electrostatic chunk including multiple layers of electrical insulating material layers, at least one layer of electrical insulating material layer including a set of heaters, the set of heaters including a plurality of heating modules, each heating module corresponding to a different part of the substrate above, wherein each heating module includes one heater and one electronic switch, the one heater and the one electronic switch being connected in series, one end of the heating module being connected to a heating power source, the other end of the heating module being connected to the ground, a heating controller including a receive end, the receive end being configured for receiving a temperature control signal, wherein the heating controller further comprises a drive signal output end that is connected to the electronic switch, the drive signal output end being configured for outputting a drive signal of the electronic switch, wherein the heating controller further comprises an optoelectrical drive circuit, such that the receive end of the heating controller is electrically isolated from the drive signal output end; wherein the optoelectrical drive circuit comprises at least one photocoupler. Alternatively, the heating controller may further include a plurality of optoelectrical drive circuits, the output end of each optoelectrical circuit being connected to the drive end of the electronic switch in the heating module so as to turn on or turn off the electronic switch.

Further, the receive end receives a temperature control signal via an optical fiber so as to further implement electrical isolation of the heating controller.

Alternatively, the plurality of heating modules in the set of heaters are fixedly connected to one of the heating power source and the ground. Alternatively, the electronic switch includes a drive end connected to the drive signal output end of the heating controller; the electronic switch further includes a second end connected to a heater, and a third end connected to the heating power source or the ground. Such fixed connection between the heating module and the heating power source or the ground enables the heating power source to be connected to the plurality of heating modules via a single filter, without a need of using a large number of filters.

Alternatively, the number of the heating modules is greater than 100.

Alternatively, the plasma reactor according to the present disclosure further comprises a parsing module, wherein the parsing module comprises a receive end which is connected to the output end of the optoelectrical drive circuit, and the parsing module further comprises a plurality of parsing module output ends, each parsing module output end being connected to the drive end of the electronic switch in one heating module such that the drive signal outputted by the optoelectrical drive circuit, after being parsed, is capable of driving the electronic switches in the plurality of heating modules.

The heating controller is disposed below the base inside the cavity; moreover, external to the heating controller is provided an electrically conductive shielding housing, such that the RF electric field inside the reaction chamber is shielded outside the electrically conductive shielding housing.

DETAILED DESCRIPTION OF EMBODIMENTS

Hereinafter, the technical solution of the present disclosure will be described in detail with reference to the accompanying drawings. It needs to be emphasized that the embodiments provided herein are only for exemplary illustrations, not excluding other embodiments utilizing the idea of the present disclosure.

Figure 1:
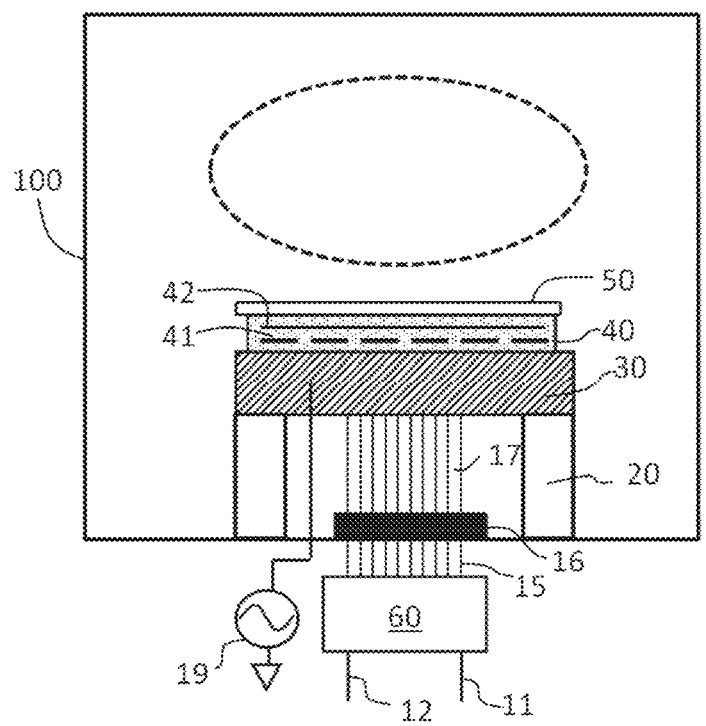
FIG. 1 is a schematic diagram of a plasma processor in the prior art.
Figure 2:
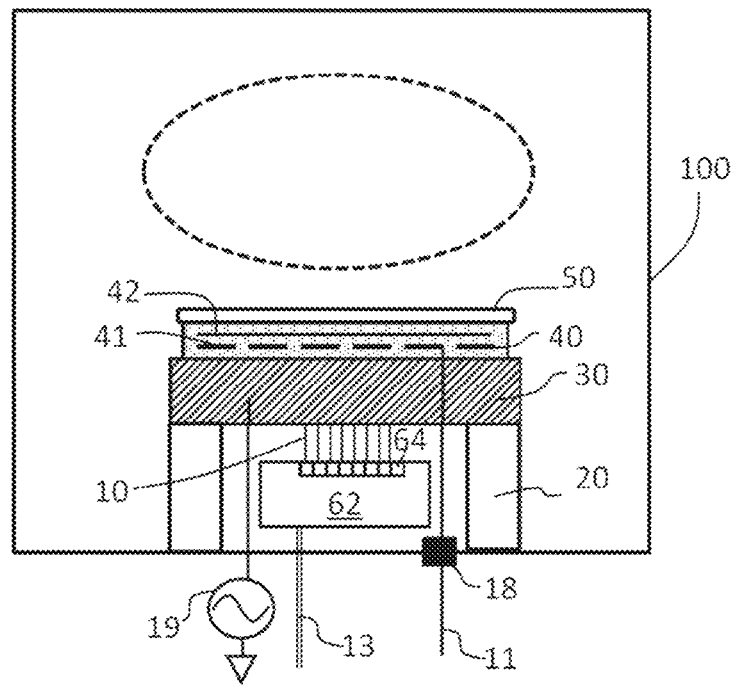
FIG. 2 is a schematic diagram of a plasma processor according to the present disclosure.

As shown in FIG. 2, the plasma reactor according to the present disclosure has a structure substantially identical to the prior art, except the drive and control system of the multi-zone temperature control heater 41. In the present disclosure, the set-of-heaters controller 62 is connected to a process controller of the plasma reactor via a control signal input line 13, wherein the control signal input line is preferably an optical fiber; an optoelectrical conversion device inside the controller 62 may identify processing parameters transmitted in an optical signal; in this way, the controller 62 may be further electrically isolated from an external circuit, thereby reducing interference with the control electrical signal. the set-of-heaters controller may also receive the control signal by other means, e.g., via Bluetooth or microwave radio signals. As frequencies of such control signals differ greatly from the RF signals in the reaction chamber, they will not interfere with each other, such that the control signals can be transmitted effectively; further, due to radio transmission, the RF power does not leak outside of the reaction chamber. In the present disclosure, the heating power source, after the RF signal is filtered by a filter 18, enters the set of heaters 41 via a single common power supply line 11, such that each heating module in the set of heaters is connected to the heating power source, without a switch selectively connect to the heating power source.

Figure 3:
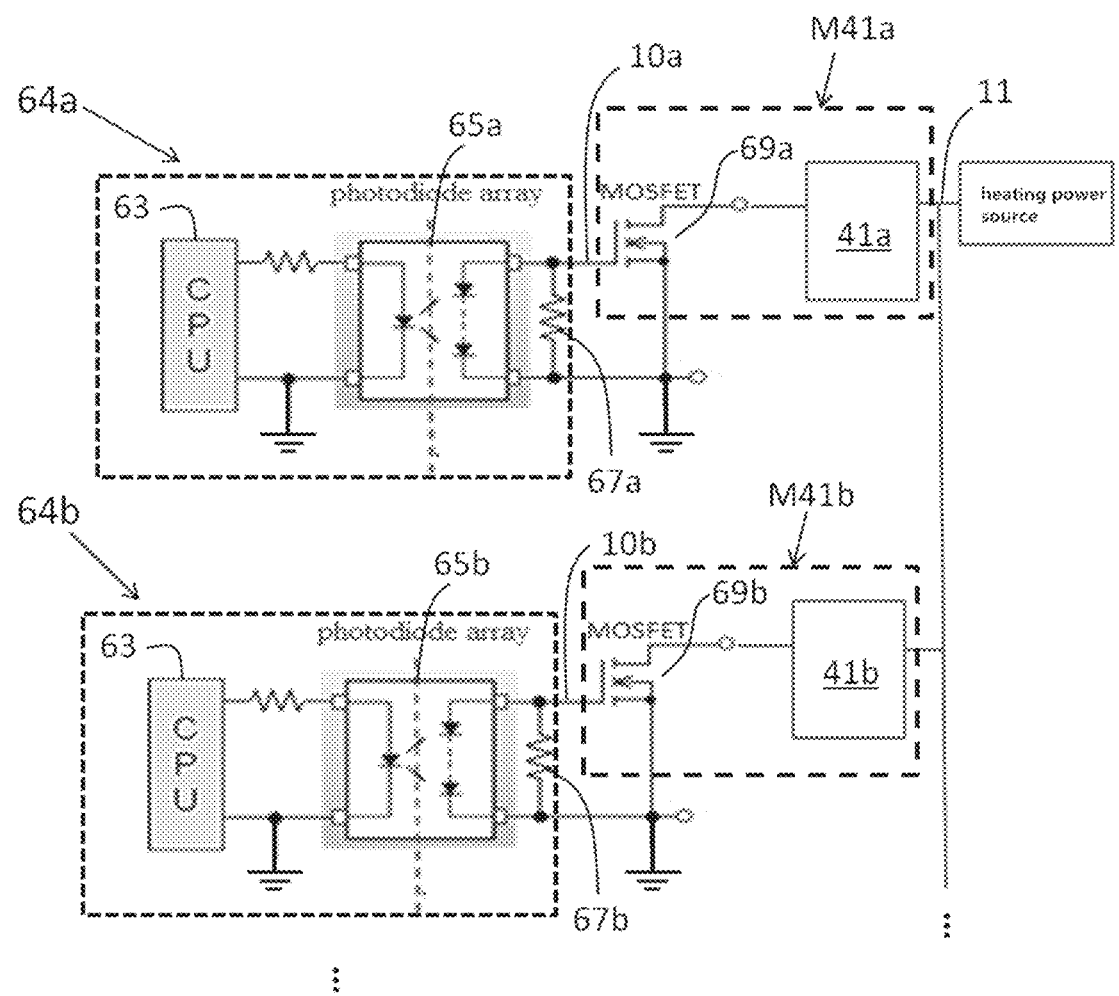
FIG. 3 is a schematic diagram of a drive control circuit of the heater according to the present disclosure.

The set-of-heaters controller 62 includes a plurality of optoelectrical assemblies 65 which are configured for enabling the control signal to go through an electrical-optoelectrical conversion process. As shown in FIG. 3, the set-of-heaters controller 62 includes a plurality of optoelectrical drive circuits 64, each of the optoelectrical drive circuits including one optoelectrical assembly 65. Hereinafter, the control structure of the present disclosure will be illustrated with a first optoelectrical drive circuit (64*a*) and a second optoelectrical drive circuit (64*b*) as an example.

The first optoelectrical drive circuit 64a includes a processor 63, wherein the processor 63 receives and processes signals from the control signal input line 13 and outputs parameters for controlling whether each heating module in the set of heaters 41 is heated as well as a heating duration. The optoelectrical assembly 65a comprises a photocoupler for converting the electrical signal into an optical signal and then converting the optical signal to the electrical signal to output. The set of heaters 41 comprises a plurality of heating modules M41, wherein each heating module includes a heater and an electronic switch in serial connection with the heater, a first end of the heater being connected to the heating power source via the power supply line 11. The output end of the optoelectrical assembly 65a is connected to the drive end of the electronic switch 69a in the first heating module 41a; a resistor 67a is connected between the drive end and the ground; the second end of the electronic switch 69a is connected to the heater 41a, and the third end of the electronic switch 69a is connected to the ground. When the processor 63 outputs a high level voltage, the electronic switch 69a is switched on due to reception of the high-level voltage signal via the drive line 10a, such that the second end of the heater 41a is connected to the ground via the switch 69a, and the current in the heating power source flows into the heater 41a for heating.

Particularly, the electronic switch herein may be an MOSFET or another type of controlled switch, e.g., thyristor, silicon-controlled rectifier, etc., and any voltage/current driven electronic switch may be applied to the heating module in the present disclosure. The heating power source in the present disclosure may be a high-voltage direct-current DC power supply or an alternating-current AC power supply, as long as it can heat the heater.

With the same structure, the second optoelectrical drive circuit 64b transmits a drive signal via the optoelectrical assembly 65b. The drive signal drives the electronic switch 69b to be switched on via the drive line 10b, such that the second heater 41b in the second heating module M41b is independently and controllably connected to the ground. In this way, only with a weak voltage drive signal, such a large number of optoelectrical drive circuits 64 may realize control of each heater to be heated independently; therefore, by simultaneously controlling a plurality of electronic switches to be switched on, a plurality of heaters may be heated simultaneously, thereby implementing individual control of the heaters.

With the photocoupler, each optoelectrical drive circuit implements electrical isolation between the controller 62 and the heaters disposed above. Preferably, the controller 62 may be provided inside a shield housing made of an electrically conductive material (e.g., metal), such that the controller 62 may be shielded from the surrounding RF radiation. Finally, the controller 62 is not only immune from radiation from the surrounding RF electric field, but also blocks current entry of the RF signal via the drive line 10a, which not only avoids leakage of the RF power but also guarantees reliable operation of the controller 62. Because all heaters are connected to a single common power supply line 11, RF power isolation of the power supply line may be implemented with one filter, which reduces the cost and space of the filter to a greater extent over the prior art.

Figure 4A:
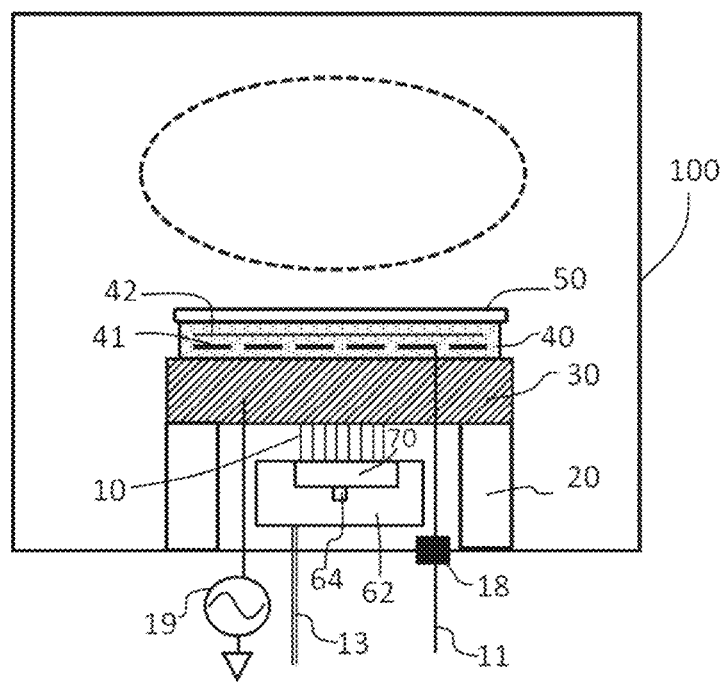
FIG. 4*a* is a schematic diagram of another type of plasma processor according to the present disclosure.
Figure 4B:
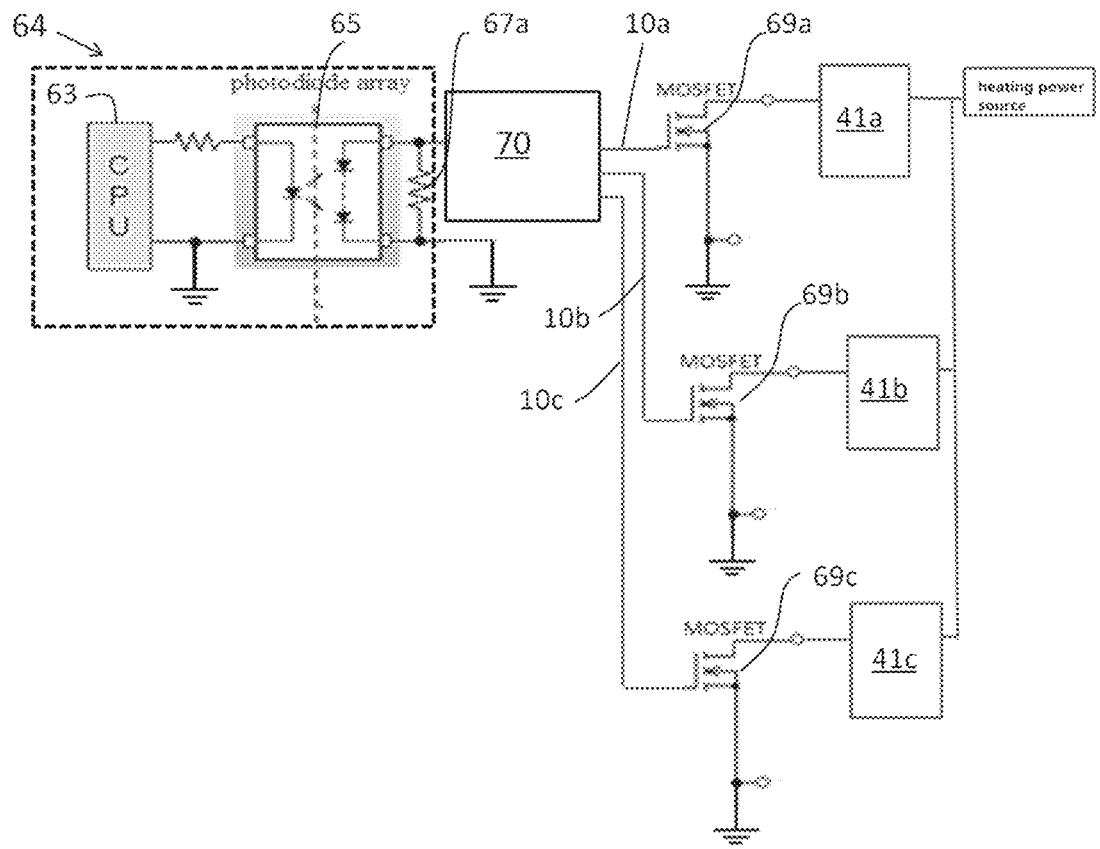
FIG. 4*b* is a schematic diagram of drive control of another type of heater according to the present disclosure.

With the drive circuit structure above, increase of the number of independent temperature control zones will also cause synchronous and dramatically increase the number of optoelectrical drive circuits 64. To further simply the drive circuit, the present disclosure provides another embodiment. FIGS. 4A and 4b show a third embodiment of the present disclosure. Compared with the first embodiment illustrated in FIG. 3 of the present disclosure, the output end of the optoelectrical assembly 65 is not directly connected to the electronic switch 69x in one heating module, but connected to the input end of one parsing module 70. The parsing module 70 further parses the control signal from the photocoupler to convert the control signal into a drive signal for the plurality of heating modules, thereby driving, via a plurality of drive lines 10a-10c, the electronic switches 69a-69c in the plurality of independent heating modules, and further driving the corresponding heaters 41a-41c to be heated independently. Particularly, the parsing module 70 may be a PLC chip, or other digital or analog circuit. The signal outputted by the optoelectrical assembly 65 is converted into a control signal; the parameters represented by the control signal are also converted to digitalized voltage signals including the parameters such as the positions of the heaters to be driven as well as the heating duration; through parsing and identifying by the parsing module 70, the control signal in the digitalized voltage signal is converted into a drive signal to output. With the parsing module 70, individual control of a large number of heating modules may be implemented by transmitting the control signal using the photocoupler(s) in one or a few optoelectrical assemblies. The parsing module 70 may be integrated into the controller 62 so as to be shielded from RF radiation by the electrically conductive material housing. In this way, both the RF electric field shielding and the power supply to the parsing module 70 may be implemented. The parsing module 70 may also be disposed in the electrically conductive base or the electrostatic chuck 40, which, however, requires a correspondingly additional independent low-voltage power supply and filter so as to prevent RF power leakage.

The heaters in respective heating modules (e.g., M41a, M41b) in the present disclosure may be collectively connected to the ground, while the other ends thereof are selectively connected to the heating power source via the corresponding electrical switches. Such a circuit structure design may also achieve the objective of the present disclosure.

In the present disclosure, one heater and one electronic switch are serially connected to be integrated into a heating module, one end of each heating module being fixedly connected to an external heating current supply line/current return line, the other end thereof being connected to the heating current return line or the current supply line via the electronic switch. At least one electrically isolated optoelectrical converter 64 outputs a drive signal to the electronic switch so as to turn the electronic switch on or off. Such a drive circuit structure design may significantly reduce the number of filters that need to be provided in the plasma reactor, thereby preventing leakage of the RF signal. On the other hand, the electronic switch in each heating module may perform individually controlling and simultaneously heating a plurality of heaters; therefore, the heaters may be driven in a wider array of operation manners, which improves flexibility in multi-zone temperature control.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A plasma reactor, comprising:
a reaction chamber enclosing a reaction space;
a base disposed at the bottom of the reaction chamber, configured for supporting the substrate;
a heating power source having a single common power line passing through the base;
a radio-frequency RF power supply which outputs RF power into the reaction chamber to generate and maintain plasma above the substrate; wherein the base includes an electrode and an electrostatic chuck disposed above the base, the electrostatic chuck including multiple layers of electrical insulating material layers, at least one layer of electrical insulating material layer including a set of heaters, the set of heaters including a plurality of heating modules, each heating module corresponding to a different part of the substrate above; wherein each heating module includes one heater and one electronic switch, the one heater and the one electronic switch being connected in series, one end of all of the heating modules being connected directly without a switch to the single common power line of the heating power source, the other end of the heating module being connected to the ground;
a filter provided on the single common power line filtering RF power;
and a heating controller, the heating controller comprising a processor coupled to a receive end, the receive end being configured for receiving a temperature control signal, and the heating controller further comprising a drive signal output end that is connected to the electronic switch, the drive signal output end being configured for outputting a drive signal of the electronic switch, wherein the heating controller further comprises an optoelectrical drive circuit interposed between the processor and the output end, such that the receive end of the heating controller is electrically isolated from the drive signal output end, thereby reducing interference with the temperature control signal;
wherein the heating controller is disposed inside the reaction chamber, and external to the heating controller is provided an electrically conductive shielding housing such that a radio-frequency RF electric field inside the reaction chamber is shielded outside the electrically conductive shielding housing, and wherein the receive end is coupled to an optical fiber and receives the temperature control signal via the optical fiber.

2. The plasma reactor according to claim 1, wherein the optoelectrical drive circuit comprises a photocoupler.

3. The plasma reactor according to claim 1, wherein in each of the plurality of heating modules in the set of heaters the electronic switch has one end connected to the heater, a second end connected to the ground and a third end coupled to the drive signal output end and to the ground via a resistor.

4. The plasma reactor according to claim 1, wherein the number of heating modules is greater than 100.

5. The plasma reactor according to claim 1, wherein the electronic switch comprises a drive end connected to the drive signal output end of the heating controller; and the electronic switch further comprises a second end connected to the heater and a third end connected to the heating power source or the ground.

6. The plasma reactor according to claim 5, further comprising a parsing module, wherein the parsing module comprises a receive end which is connected to the output end of the optoelectrical drive circuit, and the parsing module further comprises a plurality of parsing module output ends, each parsing module output end being connected to the drive end of the electronic switch in one heating module such that the drive signal outputted by the optoelectrical drive circuit, after being parsed, is capable of driving the electronic switches in the plurality of heating modules.

7. The plasma reactor according to claim 1, wherein the heating controller includes a plurality of optoelectrical drive circuits, the output end of each optoelectrical circuit being connected to the drive end of the electronic switch in one heating module so as to turn on or turnoff the electronic switch.

8. The plasma reactor according to claim 1, wherein the heating power source is connected to the plurality of heating modules via one filter.

* * * * *